(12) United States Patent
Tanaka et al.

(10) Patent No.: US 7,010,374 B2
(45) Date of Patent: Mar. 7, 2006

(54) METHOD FOR CONTROLLING SEMICONDUCTOR PROCESSING APPARATUS

(75) Inventors: Junichi Tanaka, Tsuchiura (JP); Hideyuki Yamamoto, Kudamatsu (JP); Shoji Ikuhara, Hikari (JP); Akira Kagoshima, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/377,827

(22) Filed: Mar. 4, 2003

(65) Prior Publication Data

US 2004/0175880 A1    Sep. 9, 2004

(51) Int. Cl.
*G06F 19/00* (2006.01)
(52) U.S. Cl. .................. 700/109; 700/110; 438/905
(58) Field of Classification Search ............... 700/109, 700/110; 216/2, 67; 118/715; 702/183, 702/185; 438/709, 905
See application file for complete search history.

(56) References Cited

U.S. PATENT DOCUMENTS

| | | | | |
|---|---|---|---|---|
| 5,658,423 A | * | 8/1997 | Angell et al. | 438/9 |
| 6,146,492 A | * | 11/2000 | Cho et al. | 156/345.24 |
| 6,197,123 B1 | * | 3/2001 | Poag et al. | 134/18 |
| 6,274,500 B1 | * | 8/2001 | Xuechun et al. | 438/706 |
| 6,277,235 B1 | * | 8/2001 | Wing et al. | 156/345.33 |
| 6,325,948 B1 | * | 12/2001 | Chen et al. | 216/67 |
| 6,360,132 B1 | * | 3/2002 | Lin et al. | 700/97 |
| 6,383,402 B1 | * | 5/2002 | Smith et al. | 216/60 |
| 6,449,521 B1 | * | 9/2002 | Gupta | 700/121 |
| 6,603,538 B1 | * | 8/2003 | Oluseyi et al. | 356/72 |
| 6,764,606 B1 | * | 7/2004 | Yanase | 216/75 |
| 2003/0045131 A1 | * | 3/2003 | Verbeke et al. | 438/795 |
| 2003/0119328 A1 | * | 6/2003 | Fujisato | 438/709 |

FOREIGN PATENT DOCUMENTS

WO      WO 02/03441      1/2002

* cited by examiner

*Primary Examiner*—Leo Picard
*Assistant Examiner*—Alexander Kosowski
(74) *Attorney, Agent, or Firm*—Antonelli, Terry, Stout and Kraus, LLP.

(57) ABSTRACT

A method for controlling a semiconductor processing apparatus including a vacuum processing chamber, a plasma apparatus for generating plasma inside the vacuum processing chamber, and a process controller for controlling a process by holding a process recipe including plasma cleaning of inside of the vacuum processing chamber constant, comprises the steps of detecting process abnormality of the process on the basis of sensor data detected by sensors arranged in the semiconductor processing apparatus, and executing a recovery step for removing deposition deposited inside the vacuum processing chamber when abnormality is detected.

12 Claims, 9 Drawing Sheets

LOT X

MEAN VALUE 3.5 OF INDICES

FIG.8B

LOT X+1

MEAN VALUE 4.2 OF INDICES

FIG.8C

ANTICIPATED ABNORMALITY

LOT X+2

MEAN VALUE 4.9 OF ANTICIPATED INDICES

METHOD FOR CONTROLLING SEMICONDUCTOR PROCESSING APPARATUS

CROSS REFRENCE TO RELATED APPLICATION

This application is related to U.S. application Ser. No. 09/945,691, filed Sep. 5, 2001.

BACKGROUND OF THE INVENTION

This invention relates to a method for controlling a semiconductor processing apparatus. More particularly, the invention relates to a method for controlling a semiconductor processing apparatus which method can operate the apparatus at a high rate of operation.

Processing performance of a semiconductor processing apparatus such as an etching processing apparatus varies with time as wafer processing is repeated. When this change with time proceeds, processing shape or size of a wafer surface structure acquired by etching process change gradually and a processing size eventually falls off from a management reference value→falls out of a control limit. In other words, abnormality of a process condition (process abnormality) develops.

Figure 9A:
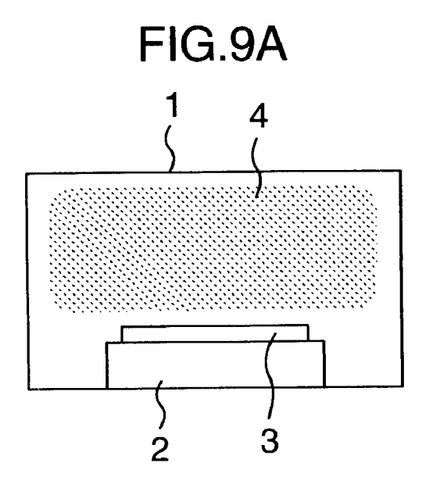
FIGS. 9A and 9B are explanatory views each useful for explaining causes of occurrence of a process abnormality.
Figure 9B:
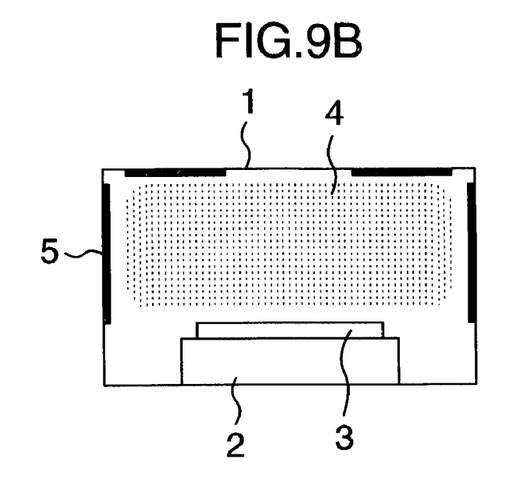

FIGS. 9A and 9B are explanatory views useful for explaining causes of the occurrence of process abnormality. FIG. 9A shows a processing chamber (vacuum processing chamber) under a clean state immediately after wet cleaning. FIG. 9B shows a state where deposition is developed onto an inner wall surface of the processing chamber as the wafer processing is repeated. In the drawings, reference numeral 1 denotes the processing chamber. Reference numeral 2 denotes a sample placement electrode on which a sample to be processed is placed. Reference numeral 3 denotes a sample such as a wafer. Reference numeral 4 denotes plasma that is generated inside the processing chamber. Reference numeral 5 denotes deposition developed onto the inner wall of the processing chamber.

When wafer processing is repeated and the deposition is developed onto the inner wall surface of the processing chamber as shown in FIG. 9B, the condition of the plasma changes due to interaction between the deposition and plasma generated inside the processing chamber, and the change of the plasma condition results in the change of the processing shape (processing size) of structures on the wafer.

The gradual change in the processing shape resulting from the change with time finally exceeds a control limit and induces a critical problem of performance of semiconductor devices fabricated on the wafer surface. In other words, a process abnormality as described above develops.

Figure 10A:
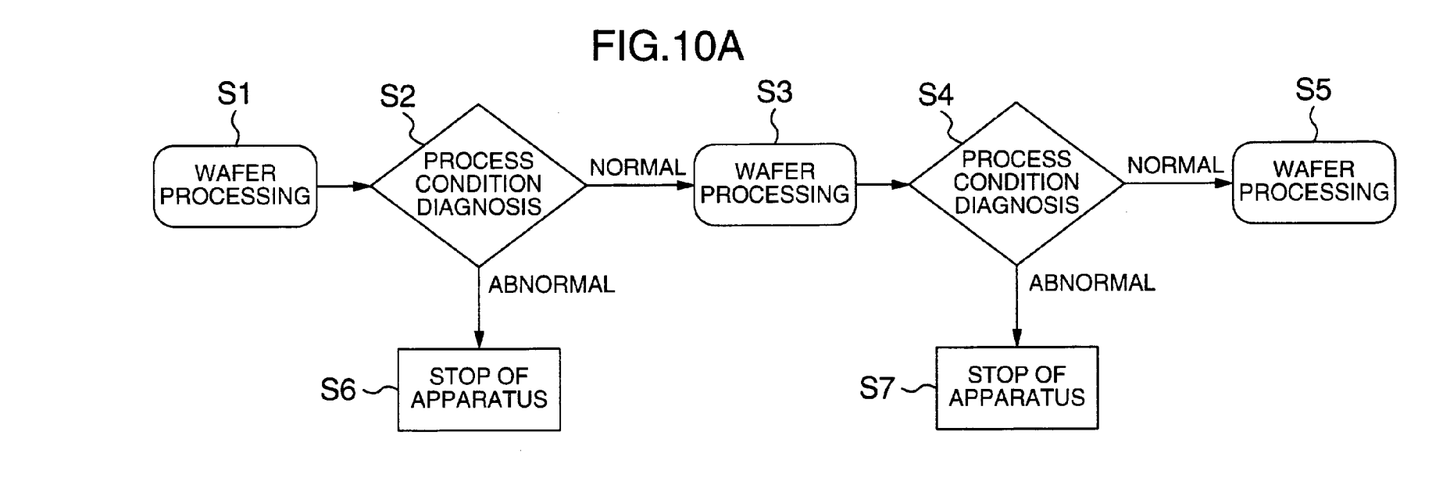
FIG. 10A and FIG. 10B are explanatory views each useful for explaining a process when the abnormality occurs.
Figure 10B:
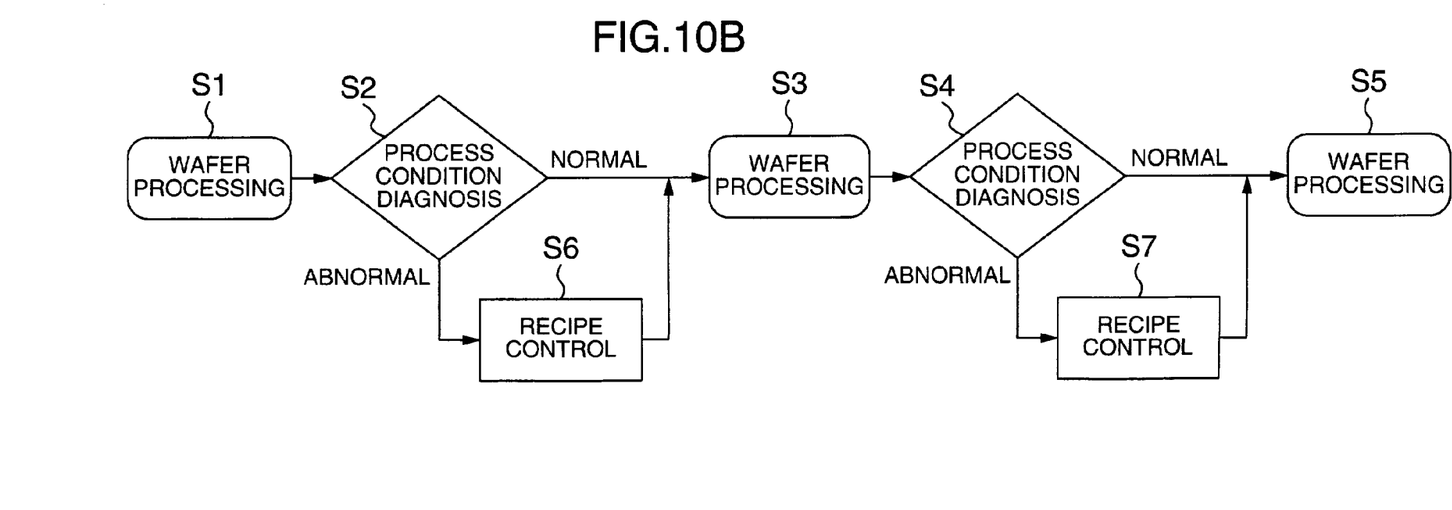

FIG. 10A and FIG. 10B explain a process when a process abnormality develops. FIG. 10A shows an example where the process is stopped upon the occurrence of the process abnormality. FIG. 10B shows an example that changes a processing method (recipe) of a next wafer when the process abnormality develops.

In the example that stops processing when the process abnormality develops, a processing result is diagnosed at the end of (or during) wafer processing on the basis of sensor data of the wafer process (Steps S1 and S2) as shown in FIG. 10A. Processing of the next wafer is stopped when the processing result proves abnormal (Step S6), but is conducted when it is normal (Step S3). This operation is thereafter repeated successively for each wafer (Steps S4, S5 and S7).

In the example that changes the processing method (recipe) of the next wafer when the process abnormality develops, the processing result is diagnosed at the end of (or during) the wafer processing on the basis of the detection data of the monitors (Steps S1 and S2) as shown in FIG. 10B. When the processing result proves abnormal, the processing method of the next wafer is controlled (that is, the recipe is changed) and the next wafer is processed (Steps S6 and S3). When the processing result proves normal, processing of the next wafer is conducted without changing the recipe (Step 3). This operation is thereafter repeated successively for each wafer (Steps S4, S5 and S7).

SUMMARY OF THE INVENTION

According to the method that stops processing whenever an abnormality develops (FIG. 10A), the operation of the semiconductor processing apparatus is stopped upon detection of the process abnormality and a recovery measure such as cleaning is taken. For this reason, an uptime of the apparatus remarkably drops in some cases. To prevent the drop of the uptime of the apparatus, a level for determining the process abnormality must be set loose.

On the other hand, the method that changes the processing method (recipe) of the next wafer when process the abnormality develops (FIG. 10B) involves a problem of the operation of the semiconductor processing apparatus. In other words, each user has his own qualification of recipes, and additional effort to qualify a new recipe occurs every time the user changes the recipe. Further, the semiconductor processing apparatus and the recipe accessorial to the former are unitary and when the recipe is changed without qualification, responsibility of the processing result cannot generally be put on a manufacturer of the semiconductor processing apparatus.

In view of these problems, the invention provides a method for controlling a semiconductor processing apparatus which method can operate the apparatus at a high uptime without the necessity for changing a recipe for controlling a process.

The invention employs the following means, by way of example, to solve the problems described above.

The invention provides a method for controlling a semiconductor processing apparatus including a vacuum processing chamber, a plasma generation apparatus for generating plasma inside the vacuum processing chamber, and a process controller for controlling a process by holding a process recipe including plasma cleaning of the inside of the vacuum processing chamber constant, wherein the process controller detects process abnormality of the process on the basis of sensor data detected by sensors arranged in the semiconductor processing apparatus, and executes a recovery step for removing deposition deposited inside the vacuum processing chamber when the abnormality is detected.

Other objects, features and advantages of the invention will become apparent from the following description of the embodiments of the invention taken in conjunction with the accompanying drawings.

DESCRIPTION OF THE EMBODIMENTS

Preferred embodiments of the invention will be explained hereinafter with reference to the accompanying drawings. Processing performance of a semiconductor processing apparatus varies with time as a wafer processing is repeatedly conducted as described above. When this change with time proceeds, a processing size of a structure on a wafer deviates out of a control limit. In other words, a process abnormality develops.

Process abnormality develops because deposition is deposited inside a processing chamber and interacts with plasma. As a result, the balance of radicals (active chemical species) in plasma changes and this change affects the processing shape, as explained already.

When wafers are processed, twenty-five or thirteen wafers generally constitute one lot in this wafer processing, and wafer processing is conducted in this lot unit. To prevent the deposition described above, a cleaning step is conducted whenever one lot of wafers is processed or whenever one wafer is processed.

The cleaning step is the one that removes the deposition deposited inside the processing chamber. When frequency of this cleaning step and a processing time required for cleaning increase, an uptime of the semiconductor processing apparatus drops.

The deposition rate changes with time, though little by little. Therefore, a fixed cleaning time cannot be optimal throughout a long operation period. When the cleaning time is set to a certain longer time to avoid this problem, the chamber wall is always overly cleaned and the parts constituting the processing chamber are worn off rapidly, thereby causing particle contamination or the reduction of parts lifetime. For this reason, the cleaning time is set to a substantially appropriate time. In this case, the deposition is gradually deposited, though locally, and the processing shape gradually changes with the deposition.

Therefore, when the processing is continued while the cleaning time is set to the substantially appropriate time as described above, it is advantageous to conduct the wafer processing while a process abnormality due to the deposition is being monitored and to insert a recovery step that collectively removes the deposition at the point when the process abnormality is detected. Because the recovery step does not prove always successful, however, it is necessary to determine success/failure of recovery and to proceed to the next wafer process after the success is confirmed.

Figure 1:
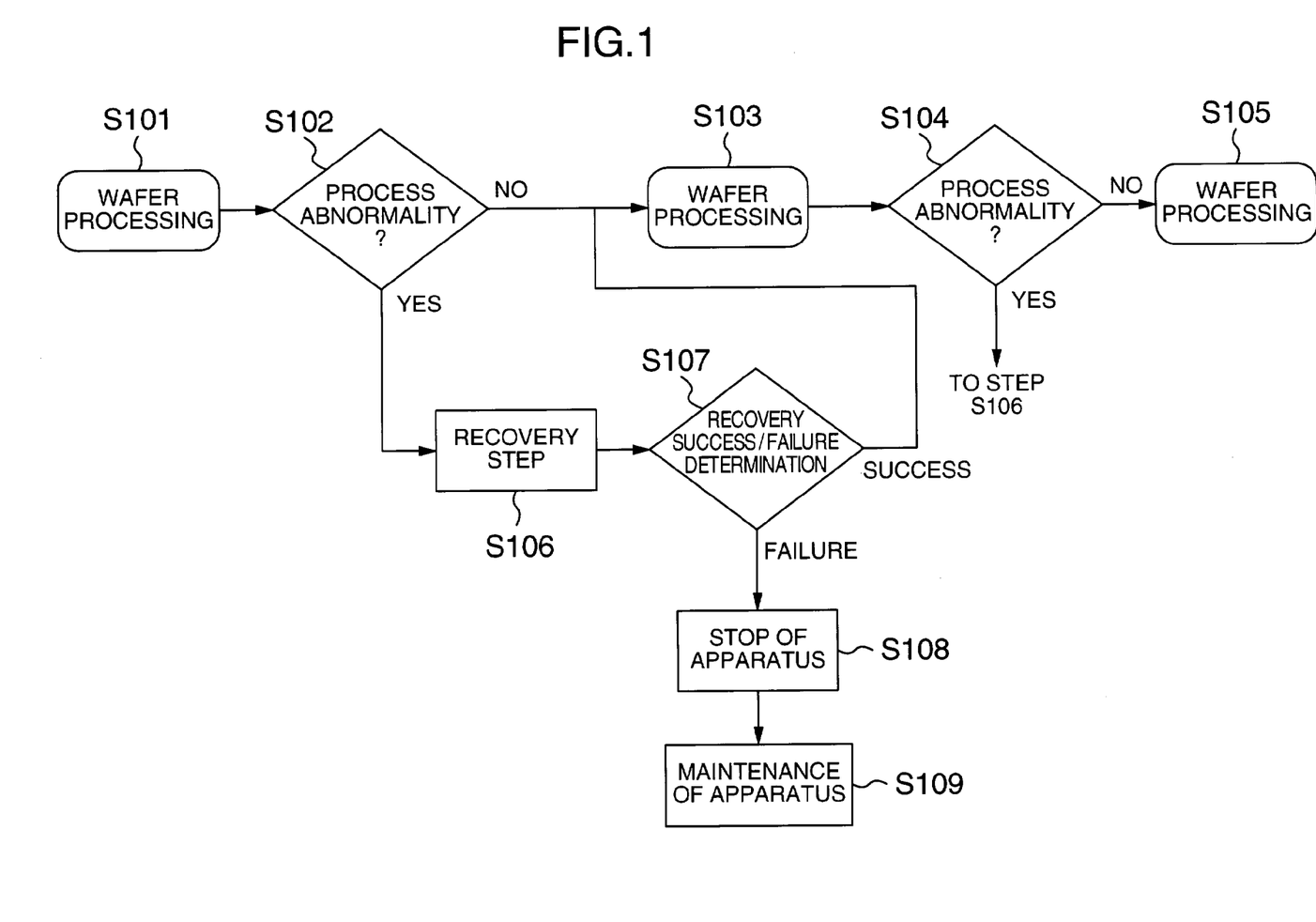
FIG. 1 is a flowchart useful for explaining a method for controlling a semiconductor processing apparatus according to an embodiment of the invention.

FIG. 1 is an explanatory view of the method for controlling a semiconductor processing apparatus according to an embodiment of the invention. First, wafers are conveyed into a plasma processing apparatus and a predetermined process is conducted (Step S101). At this time, a process condition is monitored by use of monitors. To monitor the process condition, spectroscopes are used as the monitors, for example, and detect light emission spectra of plasma. Electric quantities supplied to the plasma processing apparatus, such as a voltage, a current, a phase difference, etc, can also be detected by use of electrical sensors. A sensor for measuring characteristics of plasma or a sensor for measuring the temperature of the processing chamber can also be used. Next, the detection data of the sensors is compared with a control range (allowance range) of a standard process to determine whether or not the process is normal. This determination can be made after the end of, or during, wafer processing.

Incidentally, it is possible to use an OCD (Optical CD) measuring instrument to directly measure a line width of a device, etc, and to determine process abnormality (appropriateness of wafer processing) (Step S102).

When the process condition is determined as normal in Step 102, next wafer processing is started (Step S103).

When the process condition is determined as abnormal in Step S102, the flow proceeds to the recovery step. The recovery step is a cleaning step for removing the deposition developed onto the inner wall of the processing chamber. This step uses a processing gas suitable for removing the deposition. Since the recovery step is not so frequently conducted unlike cleaning between the lots, the uptime of the processing apparatus does not much drop even when the recovery step is conducted for a certain long time (Step S106).

After the recovery step is completed, whether or not recovery is successfully made is determined on the basis of the sensor data described above (Step 107). When recovery is determined as unsuccessful, the operation of the semiconductor processing apparatus is stopped, and maintenance such as wet cleaning is thoroughly conducted while the processing apparatus is released to the atmosphere. In this instance, it is possible to display the failure of recovery of the semiconductor processing apparatus on a display of the apparatus, or to notify a user of the failure through a communication network (Steps S108 and S109).

When recovery is determined as successful, the next wafer processing is started and the operation described above is repeatedly conducted for each wafer (Steps S103, S104 and S105).

Figure 2:
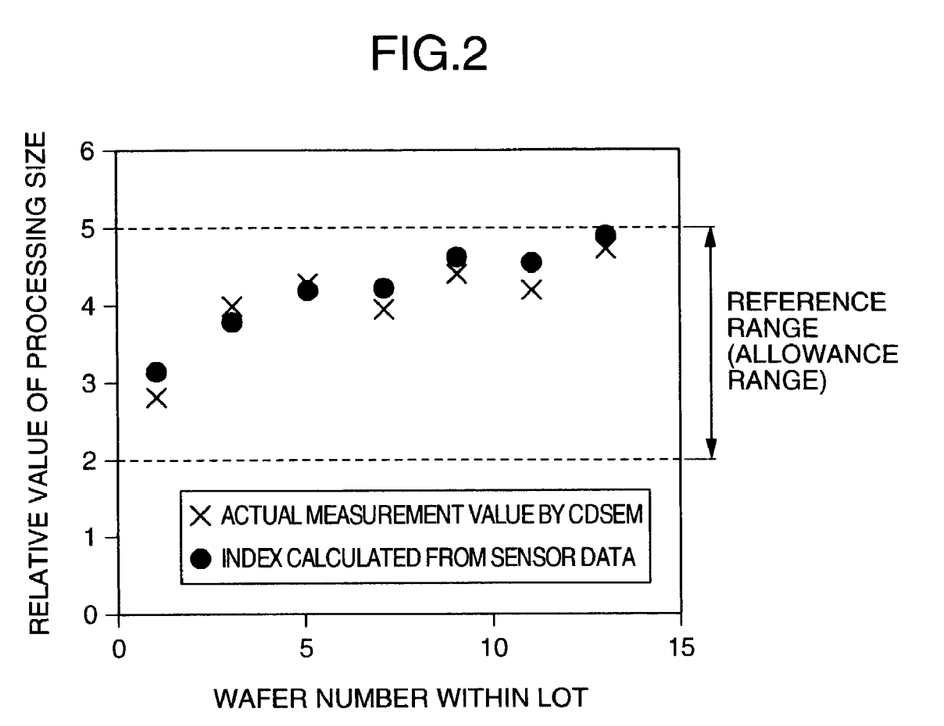
FIG. 2 is an explanatory view of a method for determining existence/absence of a process abnormality.

FIG. 2 explains a method for determining the existence/absence of process abnormality. In this case, CMOS-FETs are formed on the wafer by use of the semiconductor processing apparatus and a gate electrode width is taken as a processing size. FIG. 2 shows an example of indices (●) (estimated values) of a processing size of a gate electrode estimated on the basis of the light emission spectrum obtained from the processing of the wafer surface and actual values (X). It can be appreciated from the drawing that the actual processing size can be managed by use of the index because the index is in good agreement with the actual measurement value. In the case of the drawing, a relative value 2 to 5 of the processing size is set as the control range (allowance range) of the processing size. It can be appreciated from the drawing that the processing result of the last wafer of the lot narrowly falls within the allowance range.

When the number of sensors is extremely large such as when the spectroscope is used as the sensor, the output data of these sensors cannot be compared easily with the control range (allowance range) of the standard processing. In such a case, it is advisable to compress the sensor data through a principal component analysis, for example, to generate a smaller number of indices, that is, a principal component score, and to use this principal component score in place of the sensor data. It is further possible to combine a plurality of principal component scores to generate indices having high correlation with the processing size after processing. Even when the spectroscopes output data for 2,000 wavelengths, for example, this method needs only to compare several indices with the control range (allowance range).

Figure 3A:
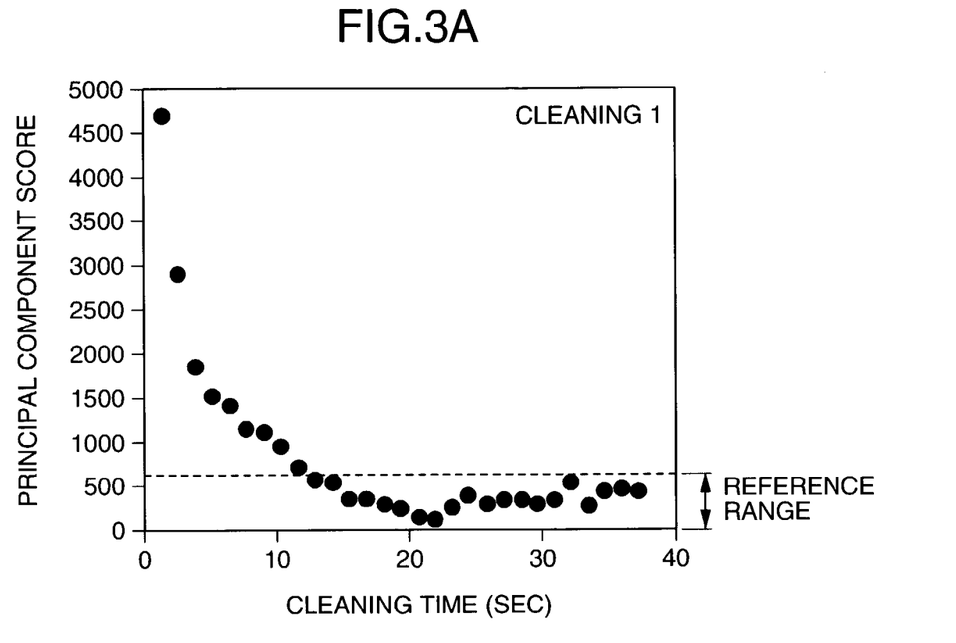
FIGS. 3A and 3B are explanatory views of a method for determining the end of a cleaning process in a recovery step.
Figure 3B:
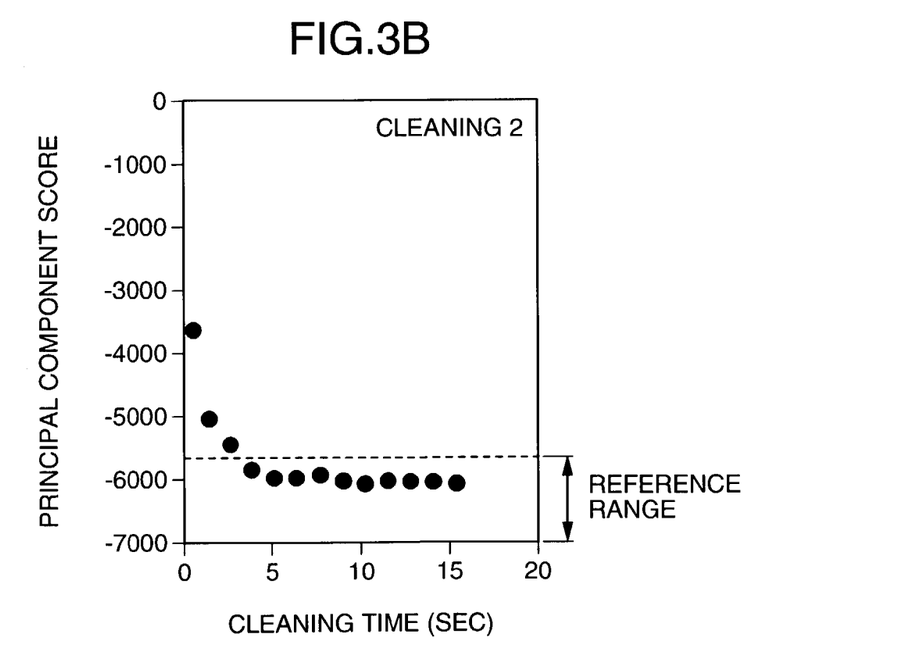

FIG. 3A and FIG. 3B explain a method for determining the end of the cleaning processing in the recovery step. The recovery step shown in these drawings executes two kinds of plasma cleaning processes having mutually different characteristics (cleaning 1 shown in FIG. 3a and cleaning 2 shown in FIG. 3B) in combination.

When the deposition on the inner wall of the processing chamber is removed through plasma cleaning of the recovery step, the condition of radicals in plasma gradually changes. When cleaning is conducted until the change of the light emission spectrum extinguishes or becomes small, it is possible to determine that almost all the depositions are removed.

In other words, to determine the end of the cleaning processing by the recovery step, the sensor first detects the spectrum of plasma light emission, the principal component score is generated on the basis of the light emission spectrum detected, and the degree of progress of cleaning, that is, the degree of progress of recovery, is detected on the basis of the principal component score. When the principal component score remains within the control range and its fluctuation is below a predetermined value, cleaning is determined as finished. In the example shown in the drawings, cleaning 2 having different cleaning characteristics is conducted after cleaning 1 is completed.

Incidentally, it is also possible to conduct cleaning for a predetermined time, to confirm the cleaning result by use of a sensor and to repeat cleaning when the cleaning result is insufficient.

Deposition that cannot be removed by plasma cleaning in the recovery step exists from time to time. In such a case, the sensor data often remains unaltered outside the control range even when the recovery step is repeatedly conducted. In this case, recovery is not possible and the cleaning processing is stopped.

Figure 4:
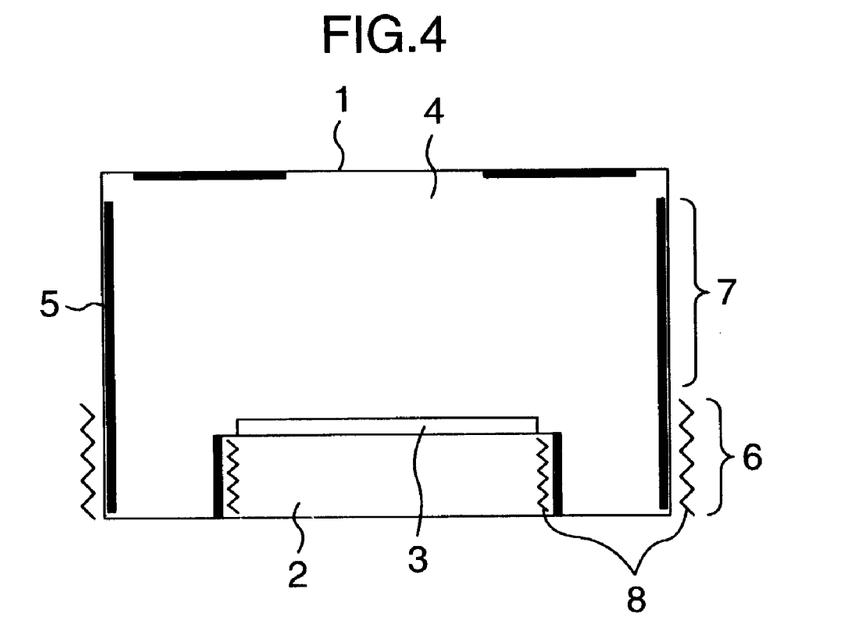
FIG. 4 is an explanatory view for explaining in detail the recovery step.
Figure 5:
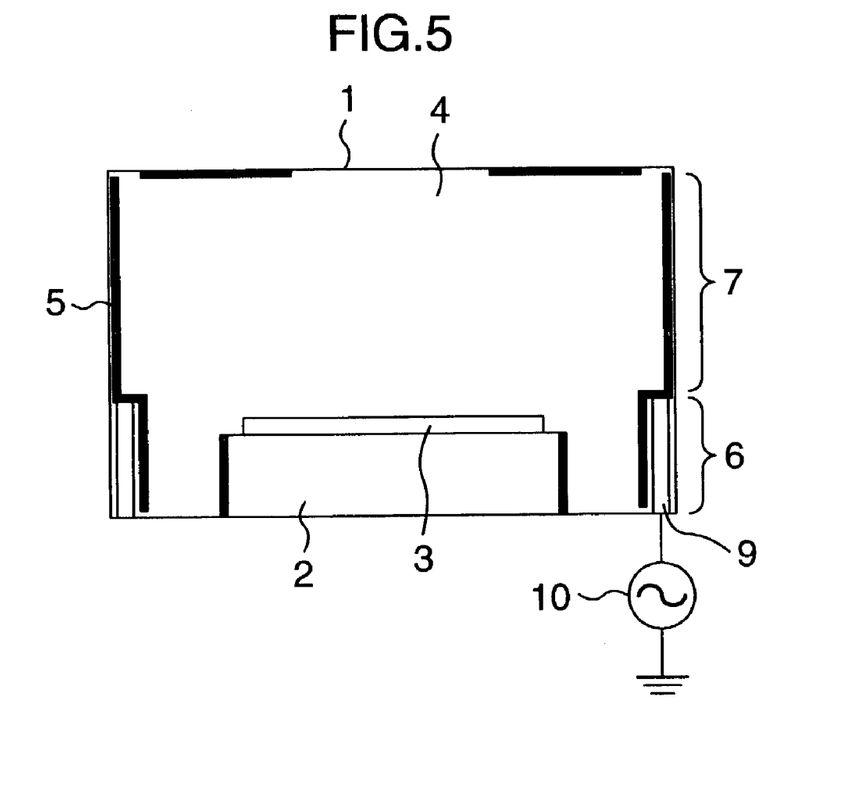
FIG. 5 is an explanatory view for explaining in detail the recovery step.

FIG. 4 and FIG. 5 explain in detail the recovery step. FIG. 4 explains an example where those parts that cannot be cleaned easily are heated. In FIG. 4, reference numeral 8 denotes heating means such as a heater. Reference numeral 6 denotes a lower wall portion of the processing chamber 1 where the deposition cannot be removed by the plasma cleaning process. Reference numeral 7 denotes an upper wall portion of the processing chamber 1. The heating means 5 is arranged at the lower wall portion of the processing chamber 1 or on the sidewall of the placement electrode 2. Incidentally, the same portion as that of FIG. 9 is denoted by the same reference numeral and its explanation is omitted.

Plasma cleaning is conducted while the heating means 8 such as a heater heats the parts that cannot be cleaned easily by ordinary plasma cleaning, such as the lower wall portion of the processing chamber 1. Since heating of the processing chamber requires time, ordinary cleaning cannot substantially conduct such a heat-treatment. In contrast, the recovery step can be conducted in the course of 1 to 3 hours, and the deposition can be efficiently removed as the processing chamber is heated. Incidentally, cooling may be conducted in place of heating.

FIG. 5 shows an example where a potential is applied to the parts that cannot be cleaned easily, such as the lower wall portion of the processing chamber 1. In the drawing, reference numeral 9 denotes a plasma generation electrode for supplying radio frequency power to the parts that cannot be cleaned easily (lower wall portion of the processing chamber 1) and generating plasma in the proximity of the parts. Reference numeral 10 denotes a radio frequency power source for generating plasma that supplies power to the electrode 8. Incidentally, the same portion as that of FIG. 9 and FIG. 1 are identified by the same reference numeral and its explanation is omitted.

Plasma cleaning is conducted by applying a radio frequency voltage from the radio frequency power source to the plasma generation electrode 6 positioned in the proximity of the parts that cannot be cleaned easily by ordinary plasma cleaning, as shown in FIG. 5. As radio frequency power is supplied in this way to the proximity of the parts that cannot be cleaned easily, radio frequency plasma is generated in the proximity of the parts. Consequently, the deposition on the surface of the parts can be efficiently removed.

The recovery step is premised on a vacuum processing apparatus that controls the process while a process recipe is kept constant during a wafer processing period and applies ordinary plasma cleaning whenever the wafers are processed in the lot unit or the wafer unit. It is the cleaning step that monitors process abnormality developing with the passage of time in such a vacuum processing apparatus and conducts cleaning at the point when process abnormality is detected. This step can collectively remove the deposition that cannot be removed by ordinary plasma cleaning.

Ordinary plasma cleaning generally uses an $SF_6$ gas or a $Cl_2$ gas or their mixed gas to generate plasma and removes the deposition on the inner wall of the processing chamber, etc, by plasma. The cleaning time is generally dozens of minutes at the longest because of throughput. In contrast, the recovery step is a cleaning step that recovers the condition of the processing chamber. Therefore, cleaning is conducted by a method different from the ordinary plasma cleaning method. In other words, the recovery step is the cleaning step having any of the following features (1) to (4).

(1) A cleaning step uses a gas that may impart damage to parts inside the processing chamber when used repeatedly in ordinary plasma cleaning (chlorine gas, for example), and conducts cleaning for a long time.

(2) A cleaning step cleans the entire processing chamber or a part of the member (parts) that cannot be cleaned easily by ordinary plasma cleaning while heating or cooling the cleaning object. Since heating or cooling of the processing chamber is time-consuming, such a heat-treatment cannot be conducted in ordinary cleaning. The recovery step can conduct cleaning in the course of about 1 to about 3 hours. Heating or cooling of the processing chamber makes it possible to more efficiently remove the deposition (see FIG. 4).

(3) A plasma cleaning step applies radio frequency power to the parts that cannot be cleaned easily by ordinary plasma cleaning. As radio frequency power is applied to the parts that cannot be cleaned easily, radio frequency plasma is generated in the proximity of the parts. In consequence, the deposition on the surface of the parts can be efficiently removed (see FIG. 5).

(4) A plasma cleaning step applies a bias potential to the parts that cannot be cleaned easily by ordinary plasma cleaning (such as lower wall portion of processing chamber 1). As the bias potential is applied to the parts that cannot be cleaned easily, the ions in plasma can be accelerated to the parts. Therefore, energy of the ions accelerated to the parts increases and the deposition on the surface can be efficiently removed.

(5) A plasma cleaning step raises a plasma density in the proximity of the parts that cannot be cleaned easily by ordinary plasma cleaning. In consequence, the deposition on the surface of the parts can be efficiently removed. The plasma density can be achieved through the control of distribution of the magnetic field generated inside the processing chamber. In an ECR plasma etching apparatus, for example, distribution of the magnetic field is controlled so that the ECR surface, where the plasma density is high, exists in the proximity of the parts.

When a process abnormality is determined in Step 1 shown in FIG. 1, etc, a recovery step suitable for the process may be selected and applied from among a plurality of recovery steps described above.

Figure 6:
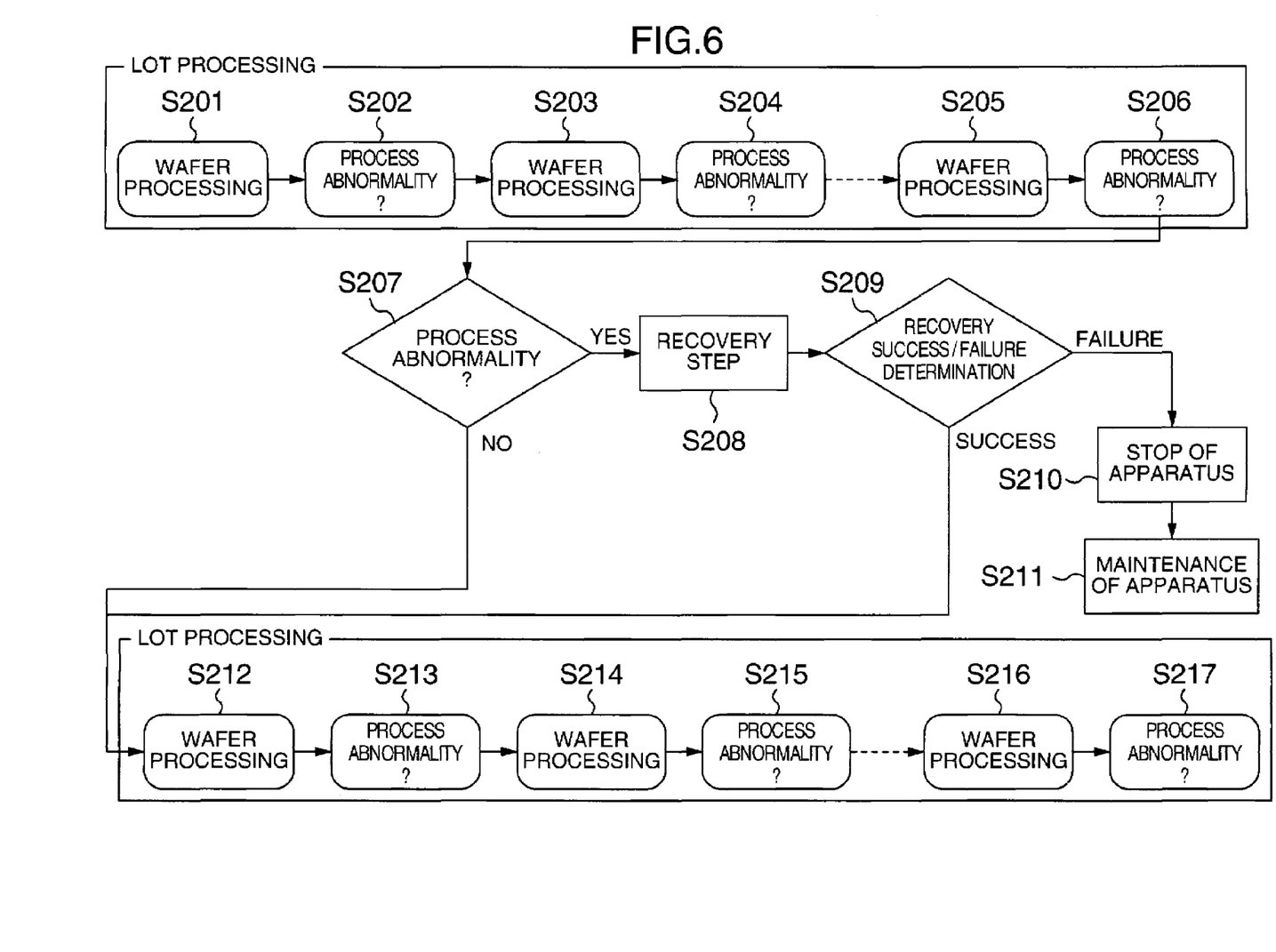
FIG. 6 is a flowchart useful for explaining another embodiment of the invention.

FIG. 6 shows another embodiment of the invention. In this embodiment, when a process abnormality is determined after processing of a specific wafer, the recovery step is conducted after processing of the lot to which the specific wafer belongs is completed.

In the embodiment described above, a process abnormality is determined for each wafer and the recovery step is inserted when the process abnormality develops. Therefore, the recovery step is inserted in the lot processing.

Generally, however, one lot is processed collectively. When the lot processing is interrupted and the recovery step is inserted, the processing shapes of the wafers discontinuously change. Therefore, even when the process abnormality is detected during processing of the lot, processing of the lot is as such continued. After processing of this lot is completed, the recovery step is executed and processing of the next lot is then started.

First, the wafers are conveyed into the plasma processing apparatus and predetermined treatment is conducted (Step S201) as shown in FIG. 6. At this time, the process condition is monitored by use of a monitor. A spectroscope is used as the monitor, for example, and detects a light emission spectrum of plasma. Electric quantities such as voltage, current and phase difference supplied to the plasma processing apparatus can also be detected by use of a probe, or the like. A sensor for measuring other plasma characteristics or a sensor for measuring the temperature of the processing chamber may be used, too. Next, the detection data of the sensor is compared with a control range (allowance range) of a standard process to determine whether or not the process is normal. This determination can be made after or during the wafer process (Step S202).

When the process condition is determined as normal in Step S202, processing of the next wafer is started (Step S203). When the process condition is determined as abnormal in Step S202, the determination result is stored in a memory. Processing is not interrupted at this time but proceeds to Step 203 as a next wafer process step. This operation is repeatedly conducted for each wafer until processing of the wafers of one lot is completed (Steps S204, S205 and S206).

After processing of one lot is completed, whether or not a process abnormality develops during processing of one lot is determined (Step S207). When the process abnormality develops, the recovery step described above is conducted. After the recovery step is completed, whether or not recovery (cleaning process) proves successful is determined on the basis of the sensor data. When recovery is determined as failure, the operation of the semiconductor processing apparatus is stopped and the apparatus is released to the atmosphere to conduct maintenance such as cleaning. In this case, it is possible to display the recovery failure condition of the semiconductor processing apparatus on a display of the apparatus, or to notify a user of the failure condition through a communication network (Steps S208, S209, S210 and S211).

When recovery is determined as successful in Step S207, processing of the next lot is started and the operation described above is repeatedly conducted for each lot (Steps S212 to S217). Incidentally, since the recovery step S208 and the step S209 for determining success/failure of recovery are the same as the recovery step S106 and the step 107 for determining success/failure of recovery explained in FIG. 1, respectively, the detailed explanation of these steps is omitted.

FIG. 7 and FIGS. 8A to 8C explain still another embodiment of the invention. This embodiment conducts trend anticipation as to whether or not a process abnormality develops during processing of a next lot, and executes a recovery step when the occurrence of the process abnormality is anticipated.

In this embodiment, indices for determining existence/absence of a process abnormality are calculated for each wafer from monitor data of spectroscopes for monitoring the processing condition during, or after, processing of a lot. The indices may be typical sensor data and principal component score data acquired by processing the sensor data, for example. Next, trend anticipation as to whether or not the process abnormality develops during processing of the next lot is conducted by using the indices. When the occurrence of the process abnormality is anticipated as a result of trend anticipation, the recovery step is conducted. When recovery proves successful, processing of the next lot is started. When recovery proves unsuccessful, the apparatus is stopped and an alarm is raised to conduct maintenance.

Figure 7:
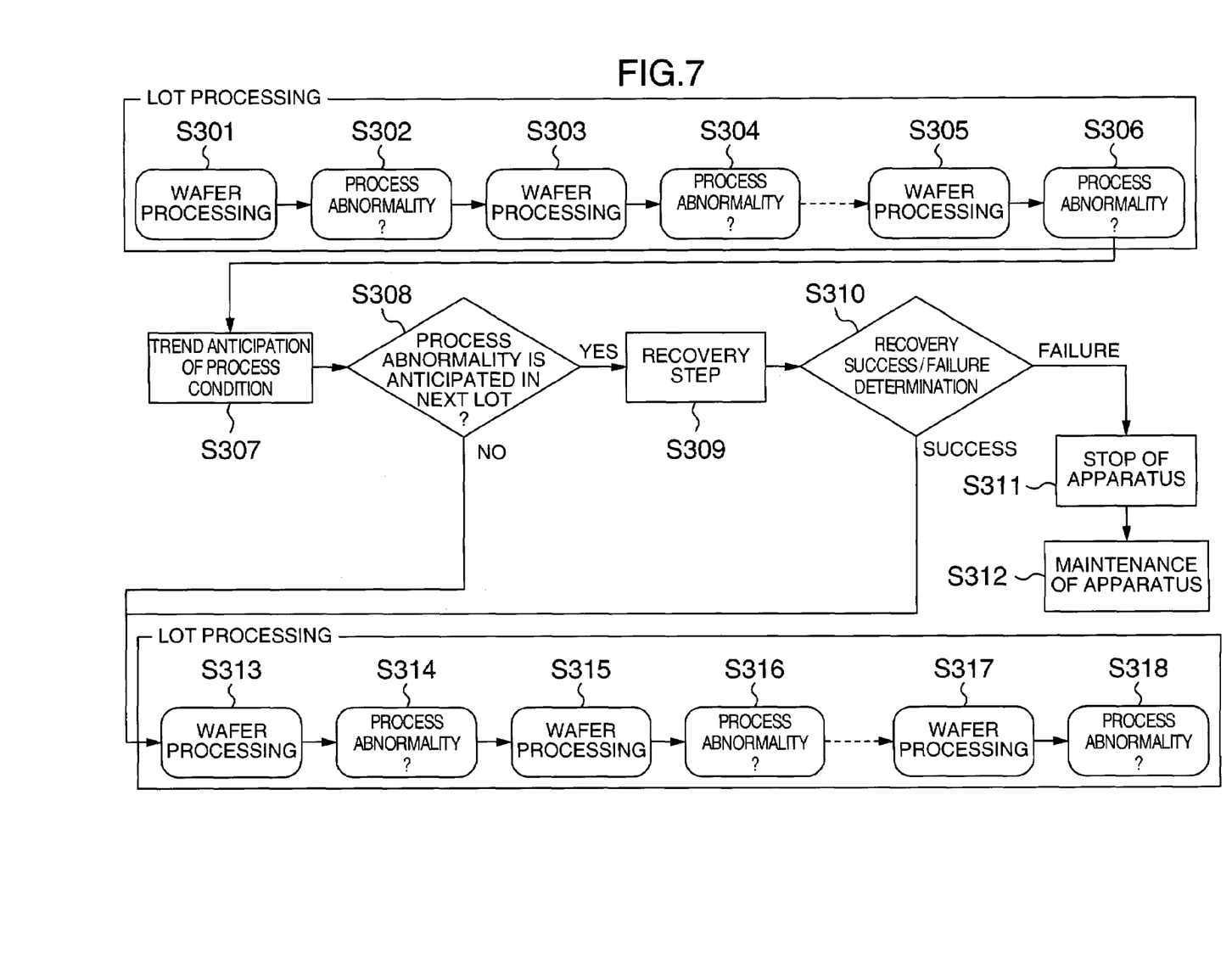
FIG. 7 is a flowchart useful for explaining still another embodiment of the invention.

Initially, the wafers are conveyed into the plasma processing apparatus and predetermined process is applied (Step S301) as shown in FIG. 7. The processing condition is monitored by use of monitors such as the spectroscopes. Next, indices for determining existence/absence of a process abnormality are calculated from each wafer from the monitor data of the spectroscopes, or the like. Electric quantities such as voltage, current and phase difference supplied to the plasma processing apparatus can be detected by use of electrical sensors. A sensor for measuring other plasma characteristics or a sensor for measuring the temperature of the processing chamber can be used, too. Next, the indices calculated from the detection data of the sensors are compared with a control range (allowance range) of a standard process to determine whether or not the process is normal. This determination can be made after, or during, processing (Step S302).

When the process condition is determined as normal in Step S302, processing of the next wafer is started (Step S303). When the process condition is determined as abnormal in Step S302, the determination result is stored in the memory. Processing is not interrupted at this time but proceeds to Step 303 as the processing step of the next wafer. This operation is repeatedly conducted for each wafer until processing of one lot is completed (Steps S304, S305 and S306).

Next, trend anticipation is made as to whether or not a process abnormality develops in processing of the next lot on the basis of the indices calculated from the detection data of the sensors described above (Step S307). When the occurrence of the process abnormality is anticipated as a result of the trend anticipation, the recovery step is executed (Steps S308 and S309) and when not, processing of the next lot is started (Steps S313 to S318). When the recovery step S309 is completed, success/failure of recovery is determined. When recovery is determined as failure, the operation of the semiconductor processing apparatus is stopped, the apparatus is released to the atmosphere and maintenance such as cleaning is carried out. It is possible at this time to display the recovery failure state of the semiconductor processing apparatus on its display, or to notify the user of the recovery failure condition through the communication network (Steps S310, S311 and S312). network (Steps S310, S311 and S312).

Because this method determines whether or not process abnormality occurs before processing proceeds to lot processing, it becomes possible to avoid continuation of the wafer process under the process abnormality condition.

Figure 8A:
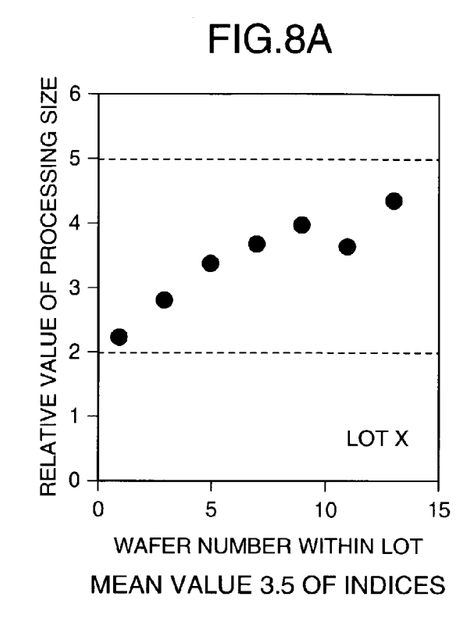
FIG. 8A to FIG. 8C are explanatory views each useful for explaining an example of trend anticipation.
Figure 8B:
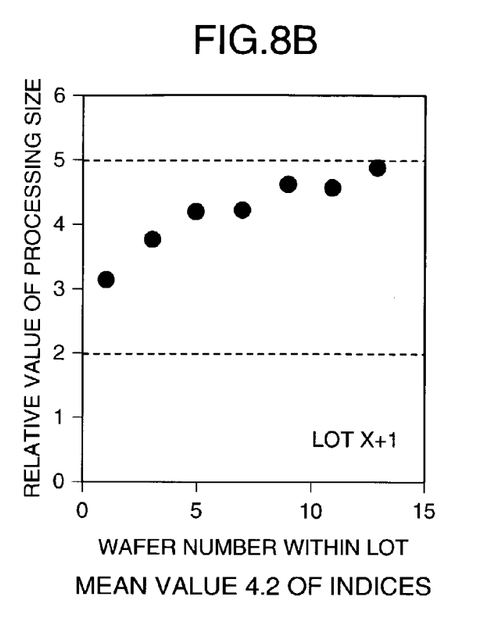
Figure 8C:
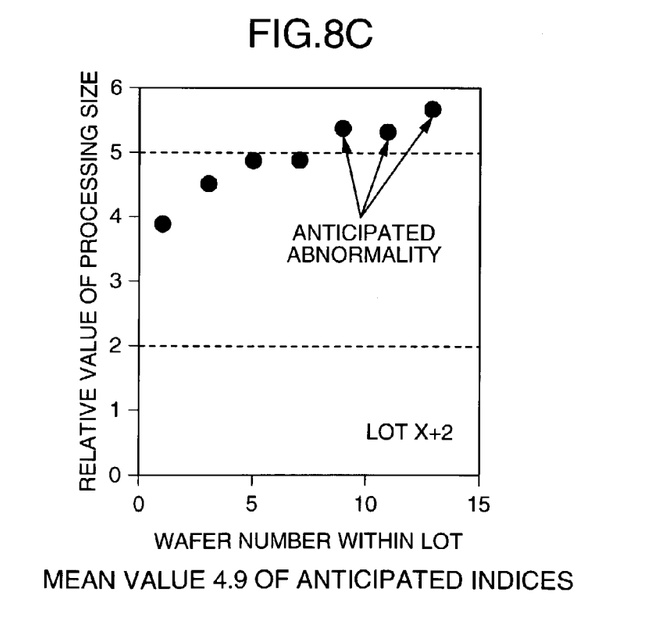

FIG. 8 explains an example of trend anticipation. FIG. 8A is a graph prepared by plotting wafers (wafer Nos. 1 to 15) belonging to a certain specific lot X and the processing results of these wafers (relative values of processing sizes). FIG. 8B is a graph prepared by plotting wafers (wafer Nos. 1 to 15) belonging to a lot X+1 processed subsequent to the lot X and the processing results of these wafers (relative values of processing sizes). Here, it is assumed that the mean value of the indices in the lot X is 3.5 and the mean value in the lot X+1 is 4.2.

In the case of this example, the mean value of the indices in the lot rises by +0.7 when processing shifts from the lot X to the lot X+1. It is therefore possible to anticipate that the mean value of the indices of the lot is 4.9 in processing of the next lot X+2. Assuming hereby that the distribution of the relative values in the lot is equivalent to the distribution in the lot X+1, the anticipated value of the indices in the lot X+2 is the sum of the index of each wafer of the lot X+1 and 0.7. In the example shown in FIG. 8C, the anticipated value of the index starts exceeding the control range from the fifth wafer of the lot X+2. Therefore, the recovery step is executed before starting processing of the lot X+2.

The explanation given above is based on the premise that cleaning treatment is conducted in the recovery step. However, other processes can be to the semiconductor processing apparatus or to its processing process. It is similarly possible to etch a dummy wafer supporting thereon a material such as aluminum (Al) and to deposit aluminum on the inner wall of the processing chamber. These processes can initialize the interior of the processing chamber to the condition corresponding to the processing process.

As explained above, the invention can provide a method for controlling a semiconductor processing apparatus capable of operating at a high uptime without changing a recipe for controlling the process. It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A process control method in a semiconductor processing apparatus, having a vacuum processing chamber, for processing wafers in a lot of wafers in accordance with a process recipe, comprising the steps of:
   (a) executing a first plasma cleaning within the vacuum processing chamber at every processing of one lot of wafers;
   (b) detecting an abnormality of the process on a basis of sensor data detected by a sensor disposed in the semiconductor processing apparatus with respect to at least one wafer of the one lot of wafers; and
   (c) when the abnormality of the process is detected during processing of at least one wafer of the one lot of wafers in the step (b), executing a second plasma cleaning within the vacuum processing chamber under a condition different from the first plasma cleaning at a timing which is after termination of processing of all wafers of the one lot of wafers which includes the at least one wafer and before starting of processing of a next lot of wafers.

2. A process control method according to claim 1, wherein the first plasma cleaning has a constant cleaning time period, and
   the method further comprises the step of determining whether or not the second plasma cleaning is successful based on sensor data detected by the sensor.

3. A process control method according to claim 1, wherein the first plasma cleaning uses a mixed gas including one of an $SF_6$ gas and an $O_2$ gas, and
   the second plasma cleaning generates plasma by using a $Cl_2$ gas.

4. A process control method according to claim 1, wherein the process is controlled by holding a process recipe.

5. A process control method in a semiconductor processing apparatus, having a vacuum processing chamber, for processing wafers in a lot of wafers in accordance with a process recipe, comprising the steps of;
   (a) executing a first plasma cleaning within the vacuum processing chamber at every processing of one lot of wafers;
   (b) detecting an abnormality of the process on a basis of sensor data detected by a sensor disposed in the semiconductor processing apparatus with respect to at least one wafer of the one lot of wafers; and
   (c) when the abnormality of the process is detected during processing of the at least one wafer of the one lot of wafers in the step (b), etching a dummy wafer supporting thereon a material which is to be deposited on an inner wall of the vacuum processing chamber at a timing which is after termination of processing of all wafers of the one lot of wafers which includes the at least one wafer and before starting of processing of a next lot of wafers, thereby to deposit the material of the dummy wafer on the inner wall of the vacuum processing chamber.

6. A process control method according to claim 5, wherein the first plasma cleaning has a constant cleaning time period, and
   the method further comprises the step of determining whether or not the etching step is successful based on sensor data detected by the sensor.

7. A process control method according to claim 5, wherein the first plasma cleaning uses a mixed gas including one of an $SF_6$ gas and an $O_2$ gas, and the material is one of aluminum and silicon.

8. A process control method according to claim 5, wherein the process is controlled by holding a process recipe.

9. A process control method in a semiconductor processing apparatus, having a vacuum processing chamber, for processing wafers in a lot of wafers in accordance with a process recipe, comprising the steps of:
   (a) executing a first plasma cleaning within the vacuum processing chamber at every processing of one lot of wafers;

(b) executing trend anticipation as to whether or not a process abnormality occurs during processing of a next lot of wafers to be processed before starting the processing of the next lot of wafers, on a basis of sensor data detected by a sensor disposed in the semiconductor processing apparatus with respect to at least one wafer of the one lot of wafers; and (c) when occurrence of the process abnormality during the processing of the next lot of wafers is anticipated during processing of the at least one wafer of the one lot of wafers or after termination of processing of all wafers of the one lot of wafers in the step (b), executing a second plasma cleaning within the vacuum processing chamber under a condition different from the first plasma cleaning at a timing which is after termination of processing of all wafers of the one lot of wafers which includes the at least one wafer and before starting of processing of the next lot of wafers.

10. A process control method according to claim 9, wherein the first plasma cleaning has a constant cleaning time period, and the method further comprises the step of determining whether or not the second plasma cleaning is successful based on sensor data detected by the sensor.

11. A process control method according to claim 9, wherein the first plasma cleaning step uses a mixed gas including an $SF_6$ gas and an $O_2$ gas, and the second plasma cleaning generates plasma by using a $Cl_2$ gas.

12. A process control method according to claim 9, wherein the process is controlled by holding a process recipe.

* * * * *